(12) United States Patent
Lee et al.

(10) Patent No.: US 11,063,230 B2
(45) Date of Patent: Jul. 13, 2021

(54) FLEXIBLE DISPLAY APPARATUS

(71) Applicant: LG Display Co., Ltd., Seoul (KR)

(72) Inventors: Wan-Hee Lee, Cheonan-si (KR); Dong-Soo Shin, Gwangju (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/555,230

(22) Filed: Aug. 29, 2019

(65) Prior Publication Data

US 2020/0203641 A1    Jun. 25, 2020

(30) Foreign Application Priority Data

Dec. 24, 2018    (KR) .......................... 10-2018-0168092

(51) Int. Cl.
```
H01L 51/00      (2006.01)
H01L 51/52      (2006.01)
G02F 1/1333     (2006.01)
G02F 1/1362     (2006.01)
H01L 27/32      (2006.01)
G06F 9/30       (2018.01)
G09F 9/30       (2006.01)
```
(52) U.S. Cl.
CPC .... *H01L 51/0097* (2013.01); *G02F 1/133305* (2013.01); *G02F 1/136286* (2013.01); *G09F 9/301* (2013.01); *H01L 27/3276* (2013.01); *H01L 51/5237* (2013.01)

(58) Field of Classification Search
CPC ......................... H01L 27/3276; H01L 51/0097
See application file for complete search history.

(56) References Cited

U.S. PATENT DOCUMENTS

2019/0165333 A1*   5/2019   Harada ............... H01L 27/3246

\* cited by examiner

*Primary Examiner* — Farun Lu
(74) *Attorney, Agent, or Firm* — Polsinelli PC

(57) ABSTRACT

Disclosed is a flexible display apparatus in which torsion prevention lines are disposed so as to prevent cracks and to detect fine cracks. The flexible display apparatus includes a flexible substrate including an active area and an inactive area, the inactive area including a first inactive area, a second inactive area provided with a circuit board disposed therein, and a bending area located between the first inactive area and the second inactive area, and torsion prevention lines disposed in a direction vertical to a length direction of the flexible substrate, in a region of the bending area of the flexible substrate, adjacent to the first inactive area, and fine crack detection lines disposed in parallel between a plurality of signal lines formed in the length direction of the flexible substrate, in the region of the bending area of the flexible substrate, adjacent to the first inactive area.

11 Claims, 6 Drawing Sheets

FLEXIBLE DISPLAY APPARATUS

This application claims the benefit of Korean Patent Application No. 10-2018-0168092, filed on Dec. 24, 2018, which is hereby incorporated by reference in its entirety.

BACKGROUND OF THE INVENTION

Field of the Invention

The present invention relates to a flexible display apparatus, and more particularly, to a flexible display apparatus in which first lines are disposed so as to prevent cracks and to detect fine cracks.

Discussion of the Related Art

As we have recently entered the information age, the field of displays which visually display electrical information signals has been rapidly developed and, in order to satisfy such development, various flat display apparatuses having excellent performance, such as thinness, light weight and low power consumption, are being developed.

As examples of flat display apparatuses, there are a liquid crystal display (LCD) apparatus, an organic light emitting diode (OLED) display apparatus, a quantum dot (QD) display apparatus, etc.

Such a display apparatus may include a display panel and a plurality of components to provide various functions. For example, one or more display driving circuits to control the display panel may be included in a display assembly. For example, driving circuits may include gate drivers, LED (source) drivers, power (VDD) routing, electrostatic discharge (ESD) circuits, multiplex (MUX) circuits, data signal lines, cathode contacts and other functional elements. A plurality of peripheral circuits to provide various additional functions, for example, a touch sensing function or a fingerprint identification function, may be included in the display assembly. Some components may be disposed on the display panel, or sometimes be disposed on peripheral areas around a display area, referred to as non-display area and/or an inactive or non-active area.

Recently, in design of display apparatuses, sizes and weights thereof are important. Further, a high ratio of the size of a display area to the size of the non-display area, which is sometimes referred to as a high screen to bezel ratio, is one of the most important characteristics. However, disposition of some of the above-described components in the display assembly requires a large non-display area which may occupy a considerable portion of the display panel. The large non-display area tends to increase the size of the display panel, and this causes difficulty in integration of the display panel into a housing of an electronic apparatus. The large non-display area may require large masking (for example, bezel, edge and covering materials) to cover a considerable portion of the display panel, and spoil an aesthetics of the apparatus.

Some components may be disposed on a separate flexible printed circuit board and be located on a backplane of the display panel. Here, the flexible printed circuit board which is bendable may be exposed to torsional force by handling during a manufacturing process due to the structure thereof, and thus a crack may be caused by force applied to a notch region.

SUMMARY OF THE INVENTION

Accordingly, the present invention is directed to a flexible display apparatus that substantially obviates one or more problems due to limitations and disadvantages of the related art.

An object of the present invention is to provide a flexible display apparatus which may prevent generation of a crack in a notch region by handling during a manufacturing process.

Another object of the present invention is to provide a flexible display apparatus which may detect a fine crack generated in a notch region.

Yet another object of the present invention is to provide a flexible display apparatus which may raise product reliability.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a flexible display apparatus includes a flexible substrate including an active area and an inactive area, the inactive area including a first inactive area adjacent to the active area, a second inactive area provided with a circuit board disposed therein, and a bending area located between the first inactive area and the second inactive area, and a plurality of first lines disposed in a direction vertical to a length direction of the flexible substrate, in a region of the bending area of the flexible substrate, adjacent to the first inactive area.

The first lines may include a metal.

The first lines may be formed of the same material as gate lines.

The first lines may have a wave shape.

The first lines may include at least one first line having a relatively small length.

The first lines may include at least one first line having a relatively small line width.

The first lines may have a length corresponding to a total width of the bending area.

The first lines may include a plurality of third lines extending in a direction vertical to the length direction of the flexible substrate, and a plurality of fourth lines spaced apart from each other at designated intervals and disposed in a direction intersecting the third lines.

The first lines may include at least one first line including only the third line between the first lines including the third lines and the fourth lines.

The fourth lines may be disposed on the entirety of the third lines.

A line width of the fourth lines may be smaller than a line width of the third lines.

The third lines and the fourth lines may be disposed in different layers.

In another aspect of the present invention, a flexible display apparatus includes a flexible substrate including an active area and an inactive area, the inactive area including a first inactive area adjacent to the active area, a second inactive area provided with a circuit board disposed therein, and a bending area located between the first inactive area and the second inactive area, and a plurality of second lines disposed in parallel between a plurality of signal lines formed in a length direction of the flexible substrate, in a region of the bending area of the flexible substrate, adjacent to the first inactive area.

A line width of the second lines may be smaller than a line width of the signal lines, such as gate lines or data lines.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. However, the present invention may be embodied in many alternative forms and should not be construed as limited to the embodiments set forth herein.

The present invention may be variously modified and have various types, and the embodiments of the present invention are provided only to completely disclose the invention and to completely inform those skilled in the art of the scope of the invention. Therefore, it should be understood that there is no intent to limit the invention to the particular forms disclosed, but on the contrary, the invention is to cover all modifications, equivalents, and alternatives within the spirit and scope of the invention as defined by the claims.

In the following description of the embodiments, it will be understood that, when the terms 'first', 'second', etc. are used to describe various elements, these terms are used merely to discriminate one element from other elements. For example, a first element may be referred to as a second element and similarly a second element may be referred to as a first element without departing from the scope of the invention.

In the following description of the embodiments, it will be understood that, when one element is 'connected to' or 'coupled to' another element, the former element may be directly connected to or coupled to the latter element or one or more other elements may be interposed between the two elements. In contrast, it will be understood that, when one element is 'directly connected to' or 'directly coupled to' another element, no element is interposed between the two elements. In the following description of the embodiments, other expressions representing relations between elements, such as 'between', directly between', 'adjacent to' or 'directly adjacent to' will be interpreted in the same manner.

It will be understood that terms used in the following description of the embodiments are used only to describe specific embodiments and do not intend to limit the invention. It will be understood that a singular expression includes a plural expression unless they have contextually different meanings. In the following description of the embodiments, the terms 'including', 'having', etc. will be interpreted as indicating presence of one or more other characteristics, numbers, steps, operations, elements or parts stated in the specification or combinations thereof, and do not exclude presence of other characteristics, numbers, steps, operations, elements, parts or combinations thereof, or possibility of adding the same.

All terms including technical or scientific terms used in the description of the embodiments have the same meanings as understood by those skilled in the art, unless defined otherwise. Terms which are generally used, such as terms defined in dictionaries, will be interpreted as having meanings coinciding with contextual meanings in related technologies, and are not interpreted as having ideally or excessively formal meanings, unless defined clearly in the description.

If one embodiment is differently implementable, functions or operations stated in specific blocks may be performed in a different order than the order stated in a flowchart. For example, functions or operations stated in two continuous blocks may be actually simultaneously performed, or be performed in the reverse order according to related functions or operations.

In the present invention, a display apparatus may include a display apparatus, including a display panel and a driver to drive the display panel in a narrow sense, such as a liquid crystal module (LCM), an OLED module or a quantum dot (QD) module. Further, in a broad sense, the display apparatus may include a final product including an LCM, an OLED module or a QD module, such as a notebook computer, a TV a computer monitor, an equipment display including an automotive display or a display of another type of vehicle, a set electronic apparatus or a set apparatus, such as a mobile electronic apparatus including a smartphone or an electronic pad.

Therefore, the display apparatus of the present invention may include a display apparatus in a narrow sense, such as an LCM, an OLED module or a QD module, or an applied product or a final product, i.e., a set apparatus, including an LCM, an OLED module or a QD module.

Further, as occasion demands, an LCM, an OLED module or a QD module including a display panel and a driver may be referred to as a "display apparatus" in a narrow sense, and an electronic apparatus including an LCM, an OLED module or a QD module and provided as a final product may be referred to as a "set apparatus", discriminately. For example, the display apparatus in a narrow sense may include a display panel, such as a LCD panel, an OLED display panel or a QD display panel, and a source PCB serving as a controller to drive the display panel, and the set apparatus may further include a set PCB connected to the source PCB and serving as a set controller to control the entirety of the set apparatus.

A display panel used in the embodiments of the present invention may be any type of display panel, such as a liquid crystal display panel, an organic light emitting diode (OLED) display panel, a quantum dot (QD) display panel or an electroluminescent display panel, and is not limited to a specific display panel in which a bezel is bendable through a flexible substrate for OLED display panels and a lower backplane support structure. Further, the display panel used in the display apparatus in accordance with the embodiments of the present invention is not limited in shape and size.

More particularly, if the display panel is an OLED display panel, the display panel may include a plurality of gate lines, a plurality of data lines, and pixels formed at intersections between the gate lines and the data lines. Further, the display panel may include a array including thin film transistors to selectively apply voltage to the respective pixels, an OLED layer provided on the TFT array, and an encapsulation substrate or an encapsulation layer disposed on the array to cover the OLED layer. The encapsulation layer may protect the thin film transistors and the OLED layer from external impact and prevent penetration of moisture or oxygen into the OLED layer. Further, layers formed on the array may include an inorganic light emitting layer, for example, a nano-scale material layer or a quantum dot layer.

Figure 1:
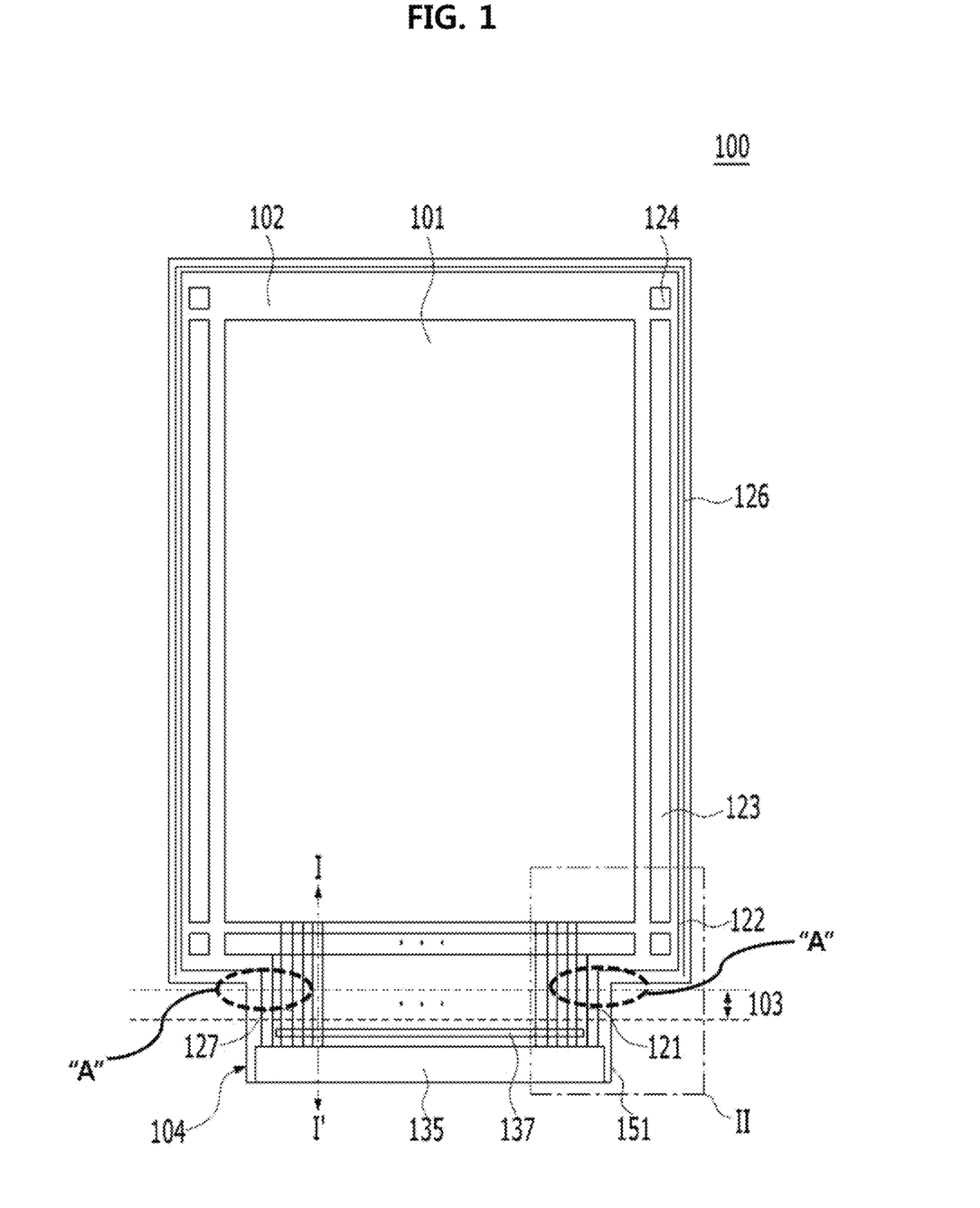
FIG. 1 is a plan view of a display panel of a flexible display apparatus in accordance with the present invention.
Figure 2:
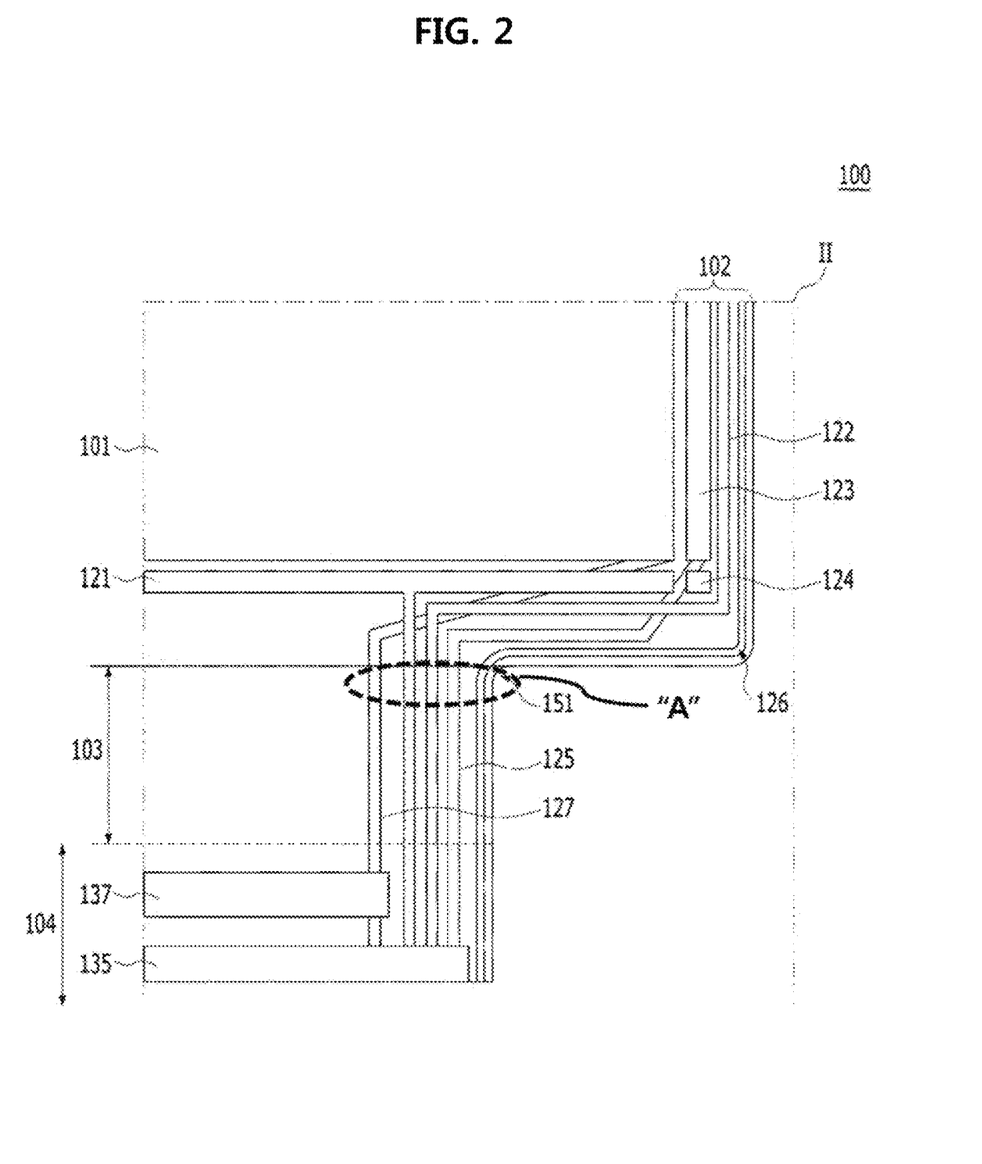
FIG. 2 is an enlarged plan view of a portion II of FIG. 1 shown in an alternating long and short dashed line, illustrating disposition of components around a notch region.
Figure 3:
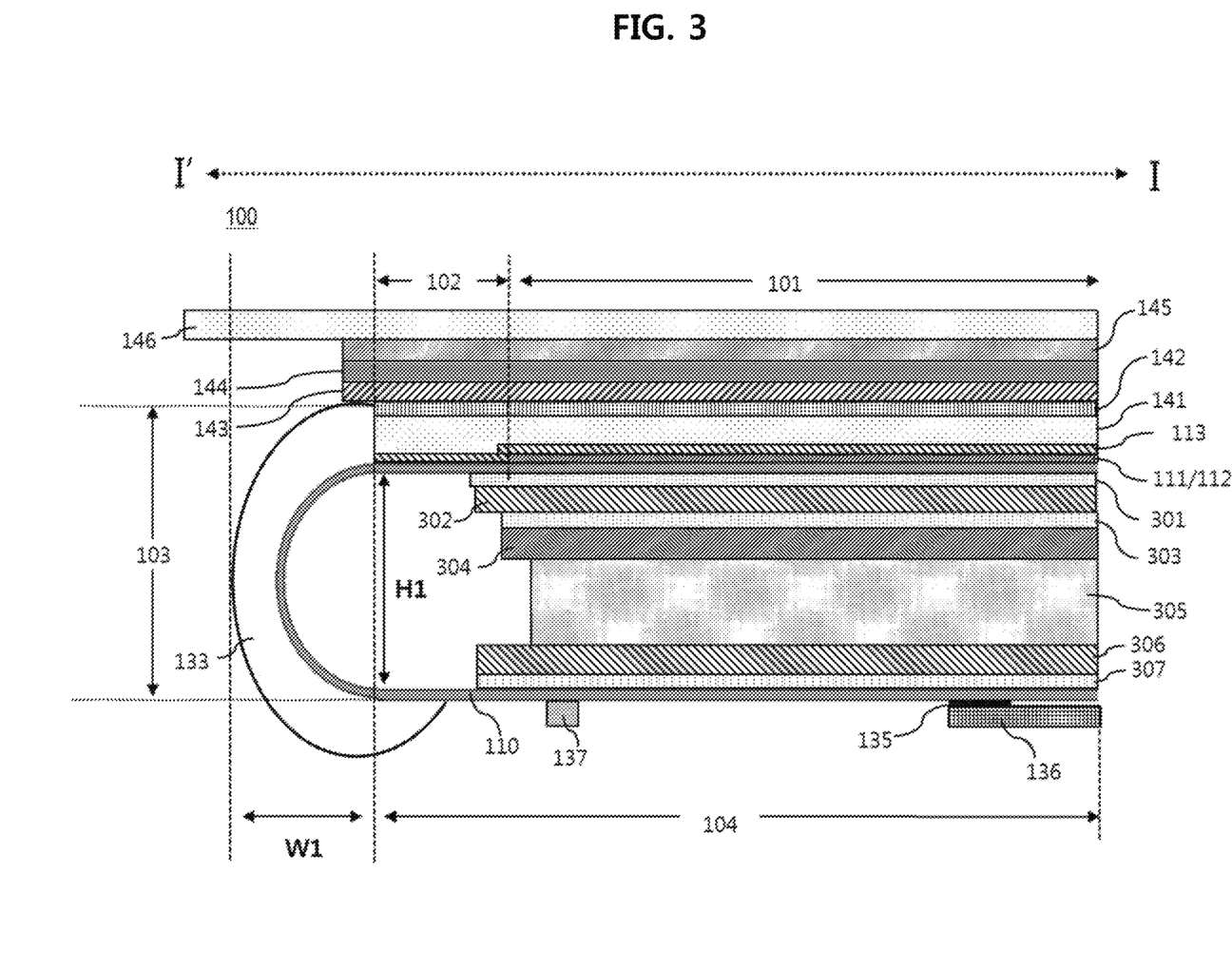
FIG. 3 is a cross-sectional view taken along line I-I' of FIG. 1, illustrating a folded structure of a flexible substrate of FIG. 1, in the flexible display apparatus in accordance with one embodiment of the present invention.
Figure 4:
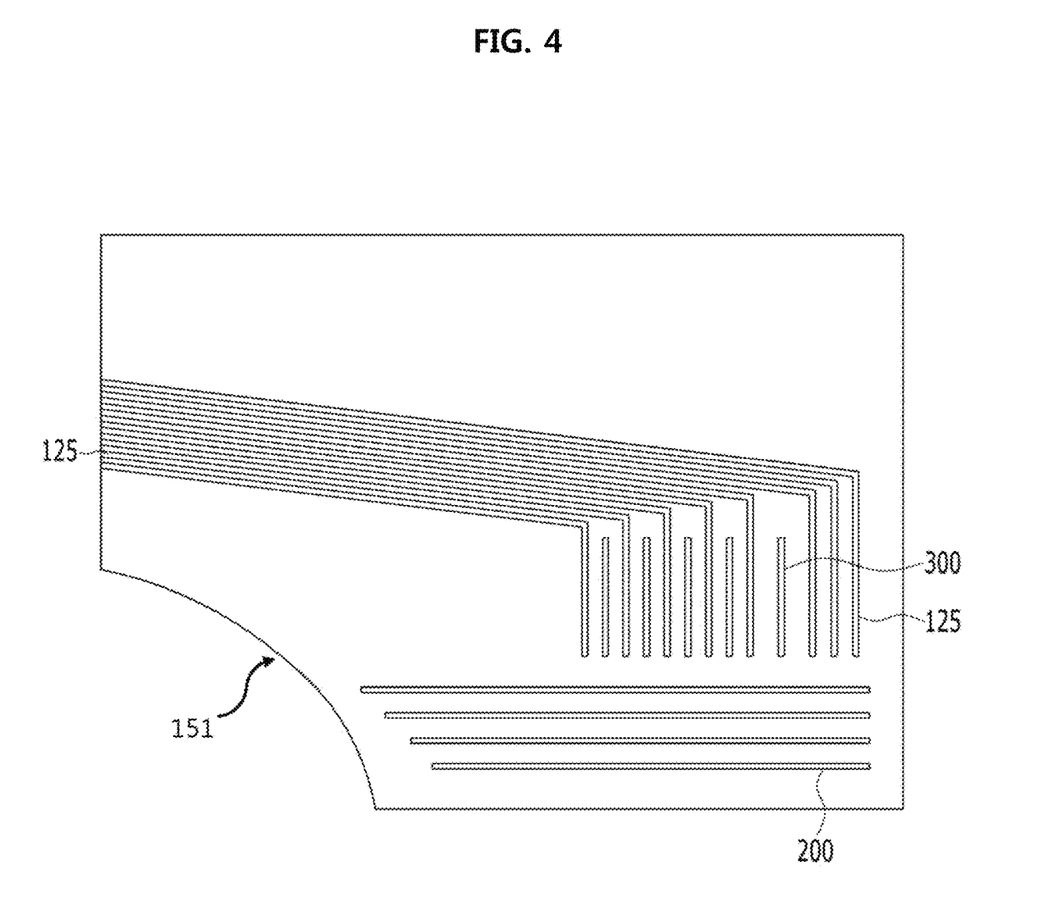
FIG. 4 is an enlarged plan view of a portion A shown in FIGS. 1 and 2 in the flexible display apparatus in accordance with one embodiment of the present invention.
Figure 5A:
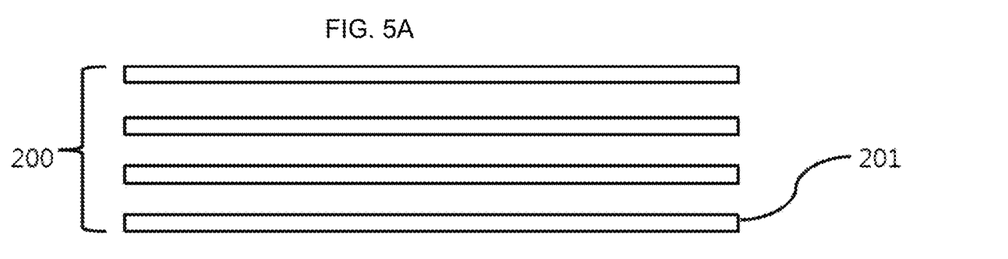
FIGS. 5A to 5D are exemplary views illustrating various shapes of a plurality of first lines of FIG. 4, respectively.
Figure 5B:
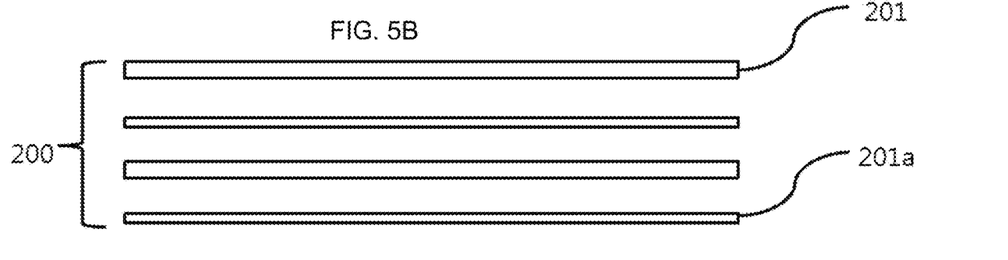
Figure 5C:
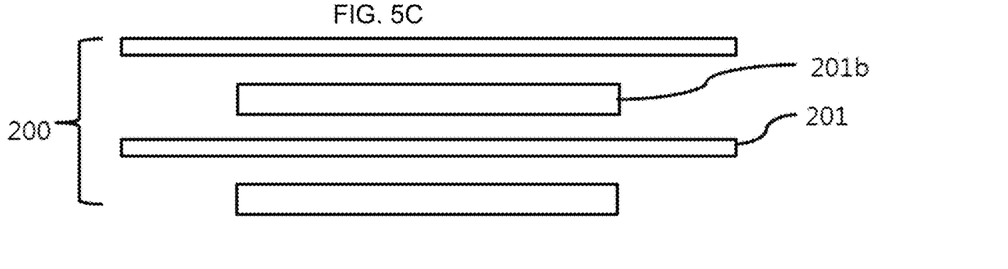
Figure 5D:
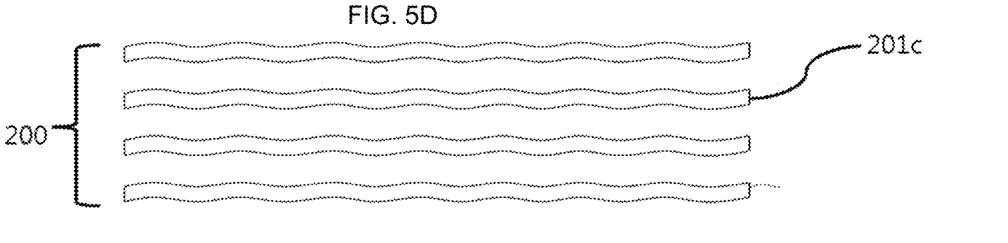

Hereinafter, the exemplary embodiments of the present invention will be described with reference to the accompanying drawings. FIG. 1 is a plan view of a display panel of a flexible display apparatus in accordance with the present invention, FIG. 2 is an enlarged plan view of a portion II of FIG. 1 shown in an alternating long and short dashed line, illustrating disposition of components around a notch region, FIG. 3 is a cross-sectional view taken along line I-I' of FIG. 1, illustrating a folded structure of a flexible substrate of FIG. 1, in the flexible display apparatus in accordance with one embodiment of the present invention, and FIG. 4 is an enlarged plan view of a portion A shown in FIGS. 1 and 2 in the flexible display apparatus in accordance with one embodiment of the present invention.

Referring to FIG. 1, a display panel 100 includes at least one active area 101 in which light emitting diodes 112 and a TFT array 111 are formed.

The display panel 100 may include inactive areas disposed at the periphery of the active area 101, and thereamong, the inactive area disposed at the top, bottom, left and right sides of the active area 101 may be referred to as a first inactive area 102 and the inactive area disposed across a bending area 103 may be referred to as a second inactive area 104. The active area 101 may have a rectangular shape but is not limited thereto, and display apparatuses having various other shapes, such as a circular shape, an oval shape or a polygonal shape, may be applied as a smartwatch or a display apparatus for vehicles. Therefore, arrangement of the first inactive area 102 and the second inactive area 104 surrounding the active area 101 is not limited to the OLED display panel 100 shown in FIG. 1. In the OLED display panel 100 shown in FIG. 1, various components to drive the light emitting diodes 112 and the TFT array 111 formed in the active area 101 are located in the first inactive area 102 adjacent to the active area 101, and may thus provide a function of emitting light. For example, circuits, such as gate-in-panels (GIPs) 123 and electrostatic discharge (ESD) circuits 124, a region for contact between cathodes of the light emitting diodes and low voltage (VSS) lines 122 corresponding to voltage reference points of the light emitting diodes, and an encapsulation layer 113 to protect the light emitting diodes 112 from external moisture or foreign substances may be disposed in the first inactive area 102. Further, a plurality of dam structures to prevent a material for a foreign substance compensation layer included in the encapsulation layer 113 from flowing to the outside of the display panel 100 during a process of depositing the foreign substance compensation layer, and a crack stopper structure 126 to prevent cracks, which may be generated during a scribing process to divide a mother substrate into respective display panels 100, from being transmitted to the inside of the display panel 100 may also be disposed in the first inactive area 102. Among the first inactive area 102, regions in which components are disposed may be referred to as first component formation parts. The first component formation parts may be disposed along major axial surfaces of the active area 101, and be bent to have an inclined surface.

The crack stopper structure 126 of the present invention prevents impact generated from a trimming line of a substrate 110 during the scribing process from reaching and thus causing damage to the GIPs 123, the electrostatic discharge (ESD) circuits 124, or the low voltage (VSS) lines 122 formed in the first inactive area 102, and further prevent growth of a dark spot or pixel shrinkage due to provision of a moisture permeation path to the light emitting diodes 112 or the TFT array 111 formed in the active area 101. The crack stopper structure 126 may include a plurality of torsion prevention lines which is described in detail below.

The crack stopper structure 126 may include an inorganic film or an organic film, and be formed to have a multilayer structure including inorganic/organic layers, without being limited thereto. FIG. 1 exemplarily illustrates the crack stopper structure 126 disposed at both long sides and one short side of the display panel 100, without being limited thereto. For example, the crack stopper structure 126 may be also disposed in a bending area and an area in which notches 151 are formed, i.e., be disposed at the entirety of the edge of the substrate 110.

In an area adjacent to the trimming line of the substrate 110, i.e., located outside the crack stopper structure 126, by partially or completely etching insulating films (a GI, a buffer layer, etc.) deposited on the entire surface of the substrate 110 when the active area 101 is formed, small amounts of the insulating films may remain on the upper surface of the substrate 110 or the upper surface of the substrate 110 may be completely exposed so that scribing impact is not transmitted to the corresponding insulating films.

Referring to FIG. 1, various components to drive the light emitting diodes 112 and the TFT array 111 formed in the active area 101 are also located in the second inactive area 104, and may thus stably provide the function of emitting light. For example, a circuit board 136 conductively connected to a pad 135 to receive a data driving signal from an external power source or transceive a touch signal with the external power source, high voltage (VDD) lines 121, the low voltage (VSS) lines 122 and/or data lines 127 may be disposed in the second inactive area 104.

The data lines 127 of the present invention may be disposed to be connected to a data driver IC 137 which generates a light emitting signal of the light emitting diode 112.

Among the second inactive area 104, a region in which the above-described pad 135 and the data driver IC 137 are disposed may be referred to as a second component formation part. In the second component formation part, some parts of the high voltage lines 121 and the low voltage lines 122 may be disposed.

Referring to FIG. 1, a notch 151 formed by cutting each of both lower corners of the display panel 100, as shown in an alternating long and short dashed line, may be disposed so as to bend the bending area 103 in the display panel 100 in accordance with the embodiment of the present invention.

For example, when the scribing process to divide a mother substrate into respective panels is performed, the notches 151 may be formed by cutting out both lower corners of the display panel 100, corresponding to parts of the first inactive area 102, so that cutting planes are adjacent to the high voltage (VDD) lines 121 or the low voltage (VSS) lines 122.

The notches 151 of the present invention may start from one end of the flexible substrate 110, a bending process may be performed around regions corresponding to the notches 151, and the bending process may be finished at a region around the data driver IC 137 so that a region of the flexible substrate 110 in which the data driver IC 137 and the pad 135 is folded to face the rear surface of the flexible substrate 100 in which the active area 101 is formed.

A member connected to the pad 135 formed on the upper surface of the display panel 100 is not limited to the circuit board 136, and various members may be connected to the pad 135 and the pad 135 may be disposed on the upper surface or the rear surface of the display panel 100.

Although FIG. 1 exemplarily illustrates the data driver IC 137 as being disposed on the upper surface of the display panel 100, an element is not limited to the data driver IC 137 and the data driver IC 137 may be disposed on the rear surface of the display panel 100 rather than the upper surface.

FIG. 2 is an enlarged view of portion II of FIG. 1. That is, FIG. 2 is an enlarged view of a region in which the notch 151 is formed, illustrating the components formed in the bending area 103, the first inactive area 102 and the second inactive area 104, before the bending process is performed.

In the display panel 100 including the active area 101, the first inactive area 102 disposed to surround the active area 102 and the second inactive area 104 disposed across the bending area 103, the notches 151 may be formed by cutting out both corners of the flexible substrate 110, covering the first inactive area 102, the bending area 103 and the second inactive area 104, thus forming a substrate cutting line shown in FIG. 2. In order to achieve a slim bezel or a narrow bezel, as the area of a substrate which is bent during the bending process is decreased, stress applied to the substrate during bending is decreased and thus processability may be further improved. Further, in order to prevent propagation of cracks which may be generated during the scribing process, the crack stopper structure 126 may be formed inside the substrate 110 along the cutting planes. As exemplarily shown in FIG. 2, the cutting planes of the substrate 110 are rounded and thus processability and durability may be improved.

The GIPs 123 and the ESD circuits 124 may be disposed at sides of the active area 101, along the low voltage lines 122 for grounding. As a gate signal or a low voltage and a high voltage, external power supplied from the pad 135 disposed in the second inactive area 104 may be supplied to the first inactive area 102 via the bending area 103 through the high voltage lines 121, the data lines 127 and gate lines 125 and be supplied to the first inactive area 102. As a data signal, power supplied from the pad 135 of the second inactive area 104 may be converted into the data signal by the data driver IC 137, and the data signal may be supplied to the active area 101 via the bending area 103 through the data lines 127. Since these various lines pass through the bending area 103, most of the lines are exposed to tensile stress and shrinkage stress when the bending process is performed, and these stresses are concentrated on a specific spot and may thus damage the lines. Thereby, the display panel 100 may malfunction. Therefore, in order to protect the lines in the bending area 103, it is important to prevent concentration of stress on a specific part of the flexible substrate 110.

FIG. 3 is a cross-sectional view taken along line I-I' of FIG. 1. For example, FIG. 3 is a cross-sectional view illustrating an exemplary stack structure of the display panel 100. For convenience of description, FIG. 3 illustrates the TFT array 111 and the light emitting diodes 112 formed on the flexible substrate 110 as a flat layer. The encapsulation layer 113 may have a three-layered film structure including an inorganic film, an organic film and an inorganic film or have a five-layered or multi-layered film structure including five or more films, and FIG. 3 illustrates the encapsulation layer 113 as a single layer.

The encapsulation layer 113 of the present invention may extend to the entirety of the active area 101 and the first inactive area 102 surrounding the active area 101 so as to protect the light emitting diodes 112 vulnerable to external moisture or dust.

The encapsulation layer 113 of the present invention may have a three-layered film structure including an inorganic film, an organic film and an inorganic film, and the inorganic films may be formed of a Si-based material, i.e., $SiN_x$, $SiO_x$, SiON, or the like.

The organic film applied to the encapsulation layer 113 may be referred to as a particle capping layer (PCL), and be formed of a material, such as epoxy resin which is a kind of polymer, without being limited thereto. The inorganic films may have a plurality of inorganic layers formed of inorganic materials, e.g., $SiN_x$ and SiON, rather than a single inorganic layer. The respective inorganic films may be formed to have a thickness of about 0.5-1 μm, and the organic film may be formed to have a thickness of about 7-20 μm, without being limited thereto.

For example, FIG. 3 illustrates a capacitive touch type sensor layer or a force-based touch type sensor layer in which touch pressure may be sensed, or a pen touch type sensor layer in which touch is input using a pen. A first adhesive layer 141 and a first touch sensor layer 142 may be further disposed on the upper surface of the encapsulation layer 113, and a second touch sensor layer (not shown) may be further disposed on the lower surface of the flexible substrate 110. A capacitive touch-type sensor layer may be disposed as the first touch sensor layer 142, and a force-based touch-type or pen touch-type sensor layer may be disposed as the second touch sensor layer. The embodiment of the present invention is not limited to the above-described touch-type flexible display apparatus, and may be applied to a touch on encapsulation (TOE)-type flexible display apparatus in which a capacitive touch-type sensor layer is formed on the encapsulation layer 113 without disposition of the second touch sensor layer.

A planarization layer 143 may be disposed on the first touch sensor layer 142 of the present invention. The planarization layer 143 may minimize effect of light generated from an external light source on the light emitting diodes in the display panel 100. The embodiment of the present invention is not limited to the structure of FIG. 3, and, in case of a product having high touch sensitivity, disposition of the first touch sensor layer 142 and the planarization layer 143 may be reversed.

A second adhesive layer 144 and a decoration film 145 may be disposed on the planarization layer 143 of the present invention, and a cover window 146 may be attached to the outermost surface of the display panel 100 so as to protect the display panel 100 from external environments.

The decoration film 145 of the present invention is located on the upper surface of the display panel 100, shields the first inactive area 102 outside the active area 101 from user's view, and may thus protect the components in the first inactive area 102 from the external light source and cause a user to see only the active area 101, thereby improving aesthetics.

A first back plate 302 may be disposed on the lower or rear surface of the flexible substrate 110. The first back plate 302 may have a thickness of, for example, 100 μm to 125 μm, 50 μm to 150 μm, 75 μm to 200 μm, less than 150 μm, or more than 100 μm, without being limited thereto. The first back plate 302 may be formed of, for example, polyethylene terephthalate (PET), without being limited thereto. A force-based touch-type sensor layer to sense touch pressure or an electromagnetic sensing-type sensor layer to recognize touch using a pen, serving as the second touch sensor layer, may be disposed on the lower surface of the substrate 110.

A metal layer 304 formed of a metal may be additionally disposed on the lower surface of the first back plate 302. The reason for additional disposition of the metal layer 304 is that noise may be generated from a battery or semiconductor chips of a module attached to the display panel 100 and such noise may cause electromagnetic interference (EMI) of the display panel 100. EMI may cause malfunction of the thin film transistors of the TFT array 111 or the organic light emitting diodes 112, or abnormality of a display screen. In order to prevent such problems, the metal layer 304 having a thickness of about 0.1 mm may be disposed and exert EMI blocking effect. Otherwise, an additional metal layer may be disposed and thus exert heat dissipating effect to distribute heat generated from a light source of the display panel 100 and stiffening effect to more firmly support the flexible substrate 110. The metal layer 304 may be adhered to the first back plate 302 by a fifth adhesive layer 303.

Without various layers at a bending part of the display panel 100, a protective may be required for line traces, particularly line traces at a bending allowable part of the display panel 100. Further, since the inorganic insulating layers may be etched from the bending part of the display panel 100, the line traces at the bending part may be vulnerable to moisture or other different materials. Particularly, during manufacture of the display panel 100, in order to test the components, various pads and conductive lines may be chamfered, and thus the conductive lines extending to the notched edges of the display panel 100 may remain. These conductive lines may be easily corroded by moisture which may spread to the adjacent conductive lines. Therefore, a protective coating layer 133 which may be referred to as a "micro-coating layer" may be provided on the line traces of the bending part of the display panel 100.

The circuit board 136 and the pad 135 therefor may be formed at one end of the flexible substrate 110. When the bending process is performed, the flexible substrate 110 is bent and folded so that the circuit board 136 adhered to the pad 135 is disposed at the back of a screen of the active area 101, thereby comparatively reducing size of the display panel 100.

The data driver IC 137, the pad 135 and the circuit board 136 conductively connected to the pad 135 which are formed on the upper surface of the flexible substrate 110 may be disposed opposite to the active area 101 by bending.

In order to protect the lines or the like on the bent flexible substrate 110, the micro-coating layer 133 may be disposed, as exemplarily shown in FIG. 3, and, in order to sufficiently protect the lines, the micro-coating layer 133 may start from a region around the data driver IC 137 and cover the entirety of the bending area 103 to reach the side wall of the first adhesive layer 141 including the encapsulation layer 113. Here, a part of the micro-coating layer 133 may be overapplied to a region around the first adhesive layer 141, or contact or be disposed close to the first touch sensor layer 142 due to surface tension between the first adhesive layer 141 and the micro-coating layer 133 at a point of time when application is terminated. The micro-coating layer 133 is applied to the region around the data driver IC 137, the bending area 103 and a region reaching the first adhesive layer 141, and may be disposed along a notch line formed across the inactive area 102 and the bending area 103, as exemplarily shown in FIG. 1.

For the same reason as the first back plate 203 disposed in the active area 101 and the first inactive area 102 to support the flexible substrate 110, a second back plate 306 may be disposed on the lower surface of the second inactive area 104. Here, the first back plate 302 may be adhered to the flexible substrate 110 by a third adhesive layer 301, and the second back plate 306 may be adhered to the flexible substrate 110 by a fourth adhesive layer 307. Disposition of the second back plate 306 may secure process stability when the data driver IC 137 and the circuit board 136 connected to the pad 135, which are formed on the upper surface of the second inactive area 104, are attached to the flexible substrate 110.

An elastomer 305 may be disposed between the lower surface of the metal layer 304 and the upper surface of the second back plate 306 of the bent flexible substrate 110 so as to maintain the bent state of the flexible substrate 110, and the metal layer 304 and the second back plate 306 may be fixedly attached to each other by the elastomer 305. The elastomer 305 may be formed of a foam tape, without being limited thereto. For example, the elastomer 305 may include a pressure sensitive adhesive, a foam-type adhesive, a liquid adhesive, an optical hardening adhesive, or other arbitrary adhesive components. The elastomer 305 may be formed of or include a compressed material, and serve as a cushion for parts coupled by the elastomer 305. Further, the elastomer 305 may include upper and lower layers formed of adhesive materials and a cushion layer interposed between the upper and lower layers, for example, include a plurality of layers including polyolefin foam.

FIG. 4 is an enlarged plan view of a portion A shown in FIGS. 1 and 2 in the flexible display apparatus in accordance with one embodiment of the present invention. That is, FIG. 4 exemplarily illustrates a portion A of the notch region, from which the bending area of the flexible substrate starts. As shown in FIG. 4, a plurality of second lines 300 (which may also be called as fine crack detection lines) is disposed between signal lines to transmit a signal from the active area to the circuit board 136 disposed in the inactive area, for example, between the gate lines 125. Here, the signal lines may be data lines. That is, a plurality of second lines 300 may be disposed between a plurality of data lines.

Further, a region of the bending area of the flexible substrate, which is adjacent to the first inactive area, i.e., a region of the bending area from which the notch region starts, may include a plurality of first lines 200 (which may also be called as torsion prevention lines) which may be disposed in a direction vertical to the length direction of the flexible substrate. The first lines 200 may prevent generation of cracks due to torsional force applied to the notch 151 during a handling process in manufacture of the flexible display apparatus. Dam-type metal lines are disposed along a force transmission path and thus prevent transmission of force. Particularly, the first lines 200 may be formed of the same metal as the gate lines 125.

If a crack is generated by transmission of force, the crack is monitored through the second lines 300. The second lines 300 may be micro-lines so as to sense generation of fine cracks. The circuit board 136 is provided with a sensor which is connected to one end of each of the second lines 300 and senses change in a resistance value. When a crack is generated and thus influences the second lines 300, the resistance value of the second lines 300 is changed. A fine crack may be detected according to change in the resistance value. Therefore, cracks may be rapidly prevented in a reliability test performed after manufacture of a product, and thus reliability of the product may be enhanced.

FIGS. 5A to 5D are exemplary views illustrating various shapes of a plurality of first lines of FIG. 4. As exemplarily shown in FIG. 5A, all of first lines 201 may have the same length and the same line width, as exemplarily shown in FIG. 5B, at least one first line 201a may have a smaller line width than other first lines 201, as exemplarily shown in FIG. 5C, at least one first line 201b may have a smaller length than other first lines 201, and, as occasion demands, as exemplarily shown in FIG. 5D, wave-shaped first lines 201c may be disposed. Further, it may be understood that combination of the above-described first lines having various shapes is possible.

Further, FIGS. 6A to 6D are exemplary views illustrating various shapes of a plurality of first lines of FIG. 4, including two types of lines, respectively.

Figure 6A:
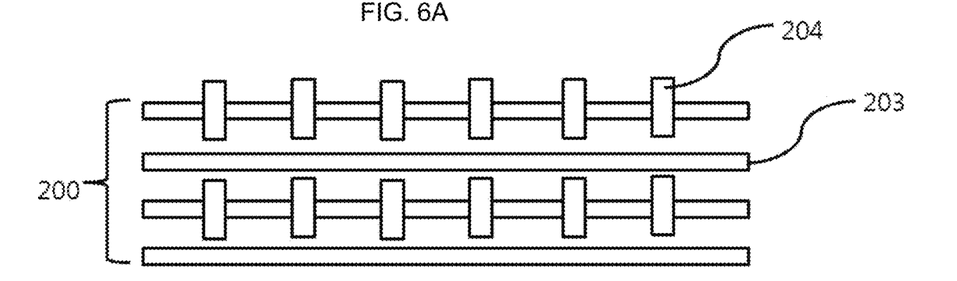
FIGS. 6A to 6D are exemplary views illustrating various shapes of a plurality of first lines of FIG. 4 including two types of lines, respectively.
Figure 6B:
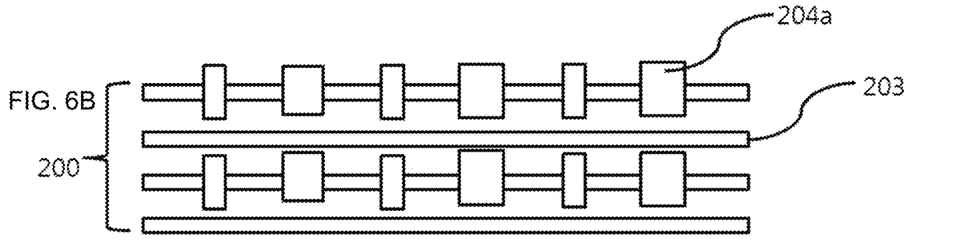
Figure 6C:
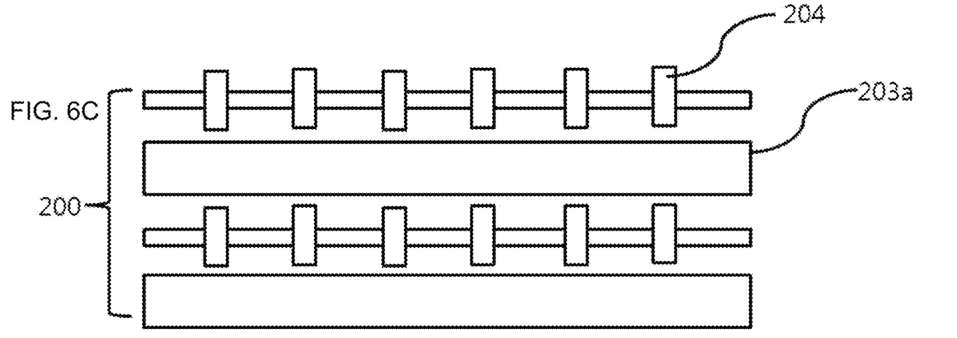
Figure 6D:
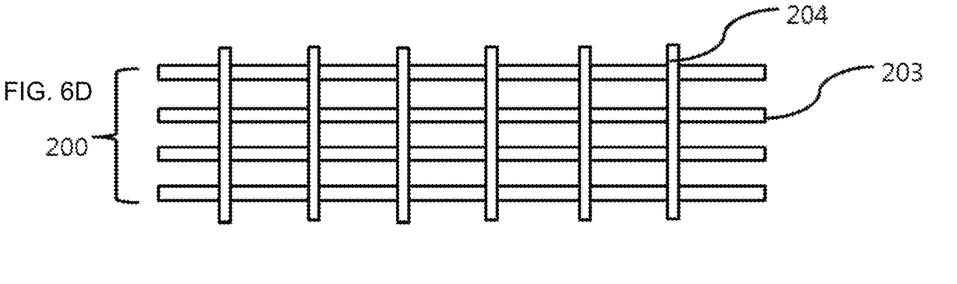

As exemplarily shown in FIG. 6A, a plurality of first lines 200 may include third lines 203 extending in a direction vertical to the length direction of the flexible substrate, and fourth lines 204 disposed at designated intervals so as to be vertical to the third lines 203. As exemplarily shown in FIG. 6B, at least one fourth line 204a may have a greater line width than other fourth lines 204, as exemplarily shown in FIG. 6C, at least one third line 203a may have a greater line width than other third lines 203, and, as exemplarily shown in FIG. 6D, first lines 200 may be configured such that a plurality of fourth lines 204 perpendicularly intersect the entirety of a plurality of third lines 203. Of course, in this case, it may be understood that combination of the above-described first lines having various shapes is possible. Further, the third lines 203 and the fourth lines 204 may be disposed in different layers.

The first lines 200 including the third lines 203 and the fourth lines 204 having different shapes and disposed in different directions may maximally block influence of torsional force on the flexible substrate, thus preventing cracks.

As described above, a flexible display apparatus in accordance with the present invention may prevent generation of a crack in a notch region by handling during a manufacturing process, detect a fine crack generated in the notch region and thus raise product reliability.

As apparent from the above description, a flexible display apparatus in accordance with the present invention may show the following effects.

First, the flexible display apparatus may prevent generation of a crack in a notch region by handling during a manufacturing process.

Second, the flexible display apparatus may detect a fine crack generated in the notch region.

Third, the flexible display apparatus may raise product reliability.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A flexible display apparatus comprising:
a flexible substrate comprising an active area and an inactive area, the inactive area comprising a first inactive area adjacent to the active area, a second inactive area provided with a circuit board disposed therein, and a bending area located between the first inactive area and the second inactive area; and
a plurality of third lines disposed in a direction vertical to a length direction of the flexible substrate, in a region of the bending area of the flexible substrate, adjacent to the first inactive area,
wherein the plurality of third lines comprise at least one third line having a relatively smaller length than the other third lines.

2. The flexible display apparatus of claim 1, wherein at least one of the plurality third lines comprises a third line extending in a direction vertical to a length direction of the flexible substrate, and a plurality of fourth lines spaced apart from each other at designated intervals and disposed in a direction intersecting the third line.

3. The flexible display apparatus of claim 2, wherein the plurality of fourth lines comprise at least one fourth line having a relatively wider line width than the other fourth lines.

4. The flexible display apparatus of claim 2, wherein the plurality of third lines comprises a plurality of third lines extending in a direction vertical to a length direction of the flexible substrate, and at least one fourth line disposed so as to intersect the entirety of the third lines.

5. The flexible display apparatus of claim 2, wherein a line width of the fourth lines is smaller than a line width of the third lines.

6. The flexible display apparatus of claim 2, wherein the third lines and the fourth lines are disposed in different layers.

7. The flexible display apparatus of claim 1, wherein the plurality of third lines comprise a metal.

8. The flexible display apparatus of claim 7, wherein the plurality of third lines are formed of the same material as gate lines.

9. The flexible display apparatus of claim 1, wherein the plurality of third lines comprise at least one wave-shaped third line.

10. The flexible display apparatus of claim 1, wherein the plurality of third lines have a length corresponding to a total width of the bending area.

11. A flexible display apparatus comprising:
a flexible substrate comprising an active area and an inactive area, the inactive area comprising a first inactive area adjacent to the active area, a second inactive area provided with a circuit board disposed therein, and a bending area located between the first inactive area and the second inactive area; and a plurality of third lines disposed in a direction vertical to a length direction of the flexible substrate, in a region of the bending area of the flexible substrate, adjacent to the first inactive area, wherein the plurality of third lines comprise at least one third line having a relatively smaller line width than the other third lines.

\* \* \* \* \*